United States Patent [19]

Büsser et al.

[11] Patent Number: 4,760,345
[45] Date of Patent: Jul. 26, 1988

[54] CHARGE AMPLIFIER CIRCUIT

[75] Inventors: Bruno Büsser, Schwerzenbach; Leo Amstutz, Neftenbach, both of Switzerland

[73] Assignee: Kistler Instrumente Aktiengesellschaft, Winterthur, Switzerland

[21] Appl. No.: 46,149

[22] Filed: May 5, 1987

[30] Foreign Application Priority Data

Jul. 18, 1986 [EP] European Pat. Off. ......... 86109912.5

[51] Int. Cl.$^4$ .............................................. H03F 1/08
[52] U.S. Cl. ........................................ 330/9; 307/491; 328/127
[58] Field of Search .................... 330/9; 307/491; 328/127, 128, 162

[56] References Cited

U.S. PATENT DOCUMENTS

| | | | |
|---|---|---|---|
| 3,541,319 | 11/1970 | James | 328/151 X |
| 3,660,769 | 5/1972 | Jordan et al. | 328/127 |
| 4,163,947 | 8/1979 | Weedon | 307/491 X |
| 4,365,204 | 12/1982 | Hadue | 330/9 X |

FOREIGN PATENT DOCUMENTS

| | | |
|---|---|---|
| 377132 | 8/1982 | Austria . |
| 1562070 | 12/1970 | Fed. Rep. of Germany . |
| 2432404 | 3/1975 | Fed. Rep. of Germany . |
| 1330497 | 9/1973 | United Kingdom . |
| 2149248 | 6/1985 | United Kingdom . |
| 2162011 | 1/1986 | United Kingdom . |

OTHER PUBLICATIONS

U. Tietze und C. H. Schenk; Halbleiter-Schaltungstechnik, 3 Aug. 1974, pp. 241-242.
Mesures, Band 37, No. 10, Part 5, "Etat Actuel de la Théorie et des Techniques d'Application des Amplificateurs Opérationnels", F. Dattée, pp. 83-90.

Primary Examiner—James B. Mullins
Attorney, Agent, or Firm—Barnes & Thornburg

[57] ABSTRACT

A charge amplifier circuit includes an operational amplifier with an integrating capacitor between its inverting input and its output, and a resetting device with a switch that is closed during the reset phase for discharging the integrating capacitor. Provided at the output of the charge amplifier circuit is a circuit arrangement with a correction amplifier which when the switch is closed, automatically delivers a correction charge to the integrating capacitor, compensating the zero shift of the output voltage from the charge amplifier circuit during the measuring phase. This circuit arrangement is particularly suited for charge amplifiers with an extremely high ohmic input stage.

5 Claims, 1 Drawing Sheet

CHARGE AMPLIFIER CIRCUIT

BACKGROUND AND SUMMARY OF THE INVENTION

The present invention relates to a charge amplifier circuit with an operational amplifier, an integrating capacitor between the inverting input and the output of the operational amplifier, and a resetting device for discharging the integrating capacitor.

Charge amplifiers as used, for example, in conjunction with piezoelectric transducers suffer from the disadvantage that their output voltage is affected by a zero shift or drift. Under certain circumstances, this fault may influence measurements adversely. It is known that the magnitude of this error and its effects on the measuring accuracy depend primarily on the quality of the input circuit and of the input stage of the charge amplifier. Among other things, the input stage must have an extremely high input resistance (typically $10^{14}$ ohms). The zero shift of the output voltage is relatively small and stable with a charge amplifier having a stable input stage, typically assembled from junction field-effect transistors (JFETs). However such input stages are subject as a rule to leakage currents which cannot be ignored, which moreover are greatly dependent on temperature, and which cause drift in the output voltage. On the other hand, input stages assembled from MOSFETs, for example, have small leakage currents, so that charge amplifiers equipped with them show less drift in the output voltage and are thus suitable also for quasi-static measurements, whereby drift compensation is not necessary in most cases. Nevertheless, MOSFET input stages have relatively poor stability. Owing to this circumstance, the zero shift of the output voltage varies with time and temperature, necessitating frequent correction if measurement is to be exact.

The object of the invention is to provide a charge amplifier circuit comprising the means named above, which effects automatic compensation of the zero shift in the output voltage and can be used on a charge amplifier with an input circuit having an extremely high resistance.

Direct-current amplifiers are known in which correction of the zero shift and other errors can be accomplished by feeding a signal back one or more times to the amplifier input after a prior feed of the signal to be amplified (DE-PS Nos. 1 562 070 and 24 32 404). In order to achieve the successive working phases of one or more amplifier stages, at least one store circuit, at least one feedback loop and several switches operating periodically must be provided. Apart from the relatively large outlay in circuitry, such circuit arrangements are unsuitable for use in a charge amplifier circuit with an extremely high ohmic input stage, and are therefore unsuited for the task involved here. In particular, the measuring operation would be disturbed by switching operations in the input circuit of the charge amplifier, and by additional loads on the amplifier input during the measuring phase caused by feedback loops.

By contrast, according to the invention, the task in question is performed by having at the output from the charge amplifier circuit a circuit arrangement with a correction amplifier, which when the resetting device is activated, automatically feeds a correcting charge to the integrating capacitor that compensates the zero shift in the output voltage of the charge amplifier circuit during the measuring phase following the reset phase.

The invention thus shows a way to accomplish correction of the zero shift on a charge amplifier circuit having an extremely high ohmic input stage resistance, by relatively simple means involving small expenditures. The integrating capacitor provided renders separate store circuit superfluous. Interruption of the input signal and additional loading of the amplifier input are avoided.

From AT-PS No. 377 132 a charge amplifier circuit is known, in which a correcting variable derived from the output voltage is likewise fed back to the charge amplifier input during the reset phase, becoming effective in the measuring phase that follows. However, this is a drift compensation, which compensates the leakage currents in the input circuit of the charge amplifier with a correcting current. For this an amplifier, a controlled A/D converter and a D/A converter are needed in the feedback circuit. In order to retain the correcting current during the measuring phase, the D/A converter must be connected permanently with the charge amplifier input. A circuit arrangement of this kind can therefore lead to measuring errors owing to the additional loading of the input circuit during the measuring phase, especially under dynamic operations with a charge amplifier having an extremely high ohmic input stage. Moreover, in view of the relatively high outlay entailed by the drift compensation according to AT-PS No. 377 132, compensation of the zero shift in accordance with the present invention constitutes a simpler and less expensive way of correcting errors where there is a choice available between using an unstable charge amplifier input with extremely high resistance and a stable one with less resistance.

Another prior art is to give an initial charge to the integrating capacitor before the measuring phase with an operational amplifier acting as integrator (U. Tietze & Ch. Schenk, Halbleiter-Schaltungstechnik, 3rd Edition, 1974, pages 241 and 242). For this purpose, with the signal source switched off, the integrating capacitor is charged by a separate voltage source. However, no feedback of the output voltage from the amplifier is provided to set up an initial charge for correction purposes. Moreover, for reasons already stated, cutting-out the signal source during the reset phase is undesirable, nor is it necessary in the case of the present invention.

A practical embodiment of the charge amplifier circuit according to this invention has the output of the charge amplifier circuit connected with the input of the correction amplifier, while the integrating capacitor is by-passed by a resistor when the resetting device is activated, and the output of the correction amplifier is connected with the inverting input of the operational amplifier via a further resistor. The resetting device preferably includes a highly insulating switch (e.g., a Reed relay), which when closed connects the two resistors with the inverting input of the operational amplifier.

The accuracy attainable by the automatic zero shift correction depends on the zero data of the correction amplifier. It is therefore of advantage to employ for this an operational amplifier whose output voltage zero drift is smaller and more stable than that of the operational amplifier forming the charge amplifier. On the other hand, the frequency response of the correction amplifier is not critical, because the reset phase lasts relatively long and the zero shifts of the charge amplifier generally proceed very slowly. The control loop which includes the correction amplifier is preferably stabilized in addition by an integrating element.

These and other objects, features and advantages of the present invention will become more apparent from the following description when taken in conjunction with the accompanying drawing which shows, for purposes of illustration only, one embodiment of the present invention.

BRIEF DESCRIPTION OF THE DRAWING

The single FIGURE is a schematic circuit diagram of a charge amplifier circuit in accordance with the present invention.

DETAILED DESCRIPTION OF THE DRAWING

Figure 1:
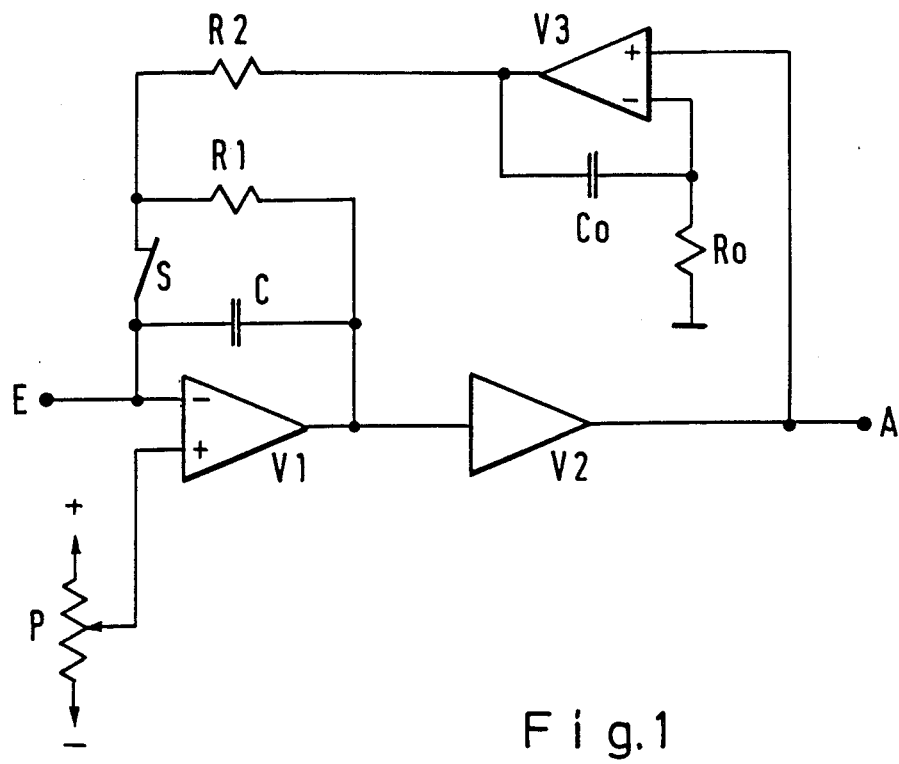

The charge amplifier circuit shown in the drawing comprises an operational amplifier V1 operated as a charge amplifier, with an integrating capacitor C between its output and its inverting input and with a resetting device including a switch S, further a follower amplifier V2 as well as a circuit arrangement with a correction amplifier V3.

The switch S of the resetting device is opened for the duration of the measuring phase, and is closed for the duration of the reset phase. When the switch S is closed, the integrating capacitor C is by-passed by a resistor R1, which during the reset phase serves to discharge the integrating capacitor C. During the measuring phase the integrating capacitor C accepts the charge to be measured, which is fed to input E of the charge amplifier. This charge is represented by the voltage at output A of the charge amplifier circuit.

A variable potential is applied to the non-inverting input of the operational amplifier V1, which is tapped from a potentiometer P connected to a voltage source. With this potentiometer P, the zero shift of the voltage at output A of the charge amplifier can be compensated during the reset phase. To ensure that the correction to compensate for the zero shift does not have to be performed manually before each measuring phase in order to obtain an exact measurement (this could be done properly only by qualified persons), the present invention provides an automatic compensation of the zero shift. The potentiometer P thereby serves only for coarse correction, for example, at the works adjustment of the charge amplifier circuit.

The output A of the charge amplifier circuit is connected with the non-inverting input of the correction amplifier V3, whose output is fed back to input E of the charge amplifier circuit via resistor R2 when the switch S is closed. In this way, a correcting charge proportional to the voltage A is fed back to the integrating capacitor C during every reset phase. This automatically compensates for the zero shift of the output voltage from the charge amplifier circuit during the measuring phase that follows the reset phase.

To ensure that the residual error which occurs remains as small as possible, an operational amplifier serves as correction amplifier V3, whose zero shift of the output voltage is much lower and more stable than that of the operational amplifier V1 constituting the charge amplifier.

The capacitor Co and resistor Ro form an integrating element cooperating with correcting amplifier V3 for stabilizing the control loop leading by way of the correction amplifier V3. A noise reduction is also achieved by this measure.

While we have shown and described only one embodiment in accordance, it is understood that the same is not limited thereto but is susceptible of numerous changes and modifications as known to those skilled in the art, and we therefore do not wish to be limited to the details show and described herein but intend to cover all such changes and modifications as are encompassed by the scope of the appended claims.

We claim:

1. A charge amplifier circuit having an input and output comprising:
   an operational amplifier having inverting input connected to said charge amplifier circuit's input and an output coupled to said charge amplifier circuit's output;
   an integrating capacitor connected between said inverting input and an output of said operational amplifier;
   a bypass resistor connected at a first end to a first side of said integrating capacitor;
   a correction amplifier means having an input connected to said charge amplifier circuit's output; and
   resetting means for connecting a second end of said bypass resistor to a second side of said integrating capacitor to discharge said integrating capacitor means and connecting an output of said correction amplifier to said inverting input of said operational amplifier to automatically supply a correction charge to said integrating capacitor when said resetting means is activated to compensate circuit output voltage when said resetting means is deactivated.

2. A charge amplifier circuit according to claim 1, wherein the correction amplifier means is an amplifier with a zero shift smaller and more stable than that of the operational amplifier constituting the charge amplifier.

3. A charge amplifier circuit according to claim 1, wherein said resetting means includes a second resistor connected to said correction amplifier means' output.

4. A charge amplifier circuit according to claim 1, wherein said resetting means includes a switch having a first terminal connected to said second side of said integrating capacitor and said inverting input of said operational amplifier and a second terminal connected to said second end of said bypass resistor and said output of said correction amplifier means.

5. A charge amplifier circuit according to claim 1, including an adjustable resistor connected to a noninverting input of said operational amplifier.

* * * * *